United States Patent
Staudinger et al.

(10) Patent No.: US 6,833,761 B2
(45) Date of Patent: Dec. 21, 2004

(54) AMPLIFIER APPARATUS AND METHOD THEREOF

(75) Inventors: Joseph Staudinger, Gilbert, AZ (US); Monte Gene Miller, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/376,614

(22) Filed: Feb. 28, 2003

(65) Prior Publication Data
US 2004/0169560 A1 Sep. 2, 2004

(51) Int. Cl.$^7$ ................................................. H03F 3/14
(52) U.S. Cl. ................................... 330/307; 330/302
(58) Field of Search ........................... 330/307, 295, 330/302, 124 R; 257/690, 784, 738

(56) References Cited

U.S. PATENT DOCUMENTS 6,127,894 A * 10/2000 Alderton ..................... 330/286
6,297,700 B1 * 10/2001 Sevic et al. ................. 330/277
6,429,510 B1 * 8/2002 Moller ........................ 257/690
6,583,673 B2 * 6/2003 Ahl et al. .................... 330/310

OTHER PUBLICATIONS

Fujitsu FLL2400IS–2C.

* cited by examiner

Primary Examiner—Henry Choe
(74) Attorney, Agent, or Firm—Toler, Larson & Abel, LLP

(57) ABSTRACT

A power amplifier device having a conductive structure overlying a dielectric layer. The conductive structure has a first conductive structure portion that is substantially electrically isolated from a second conductive structure portion. A first plurality of bond wires couple the first conductive structure portion to an amplifying device, while a second plurality of bond wires couple the second conductive structure portion to the amplifying device.

20 Claims, 4 Drawing Sheets

AMPLIFIER APPARATUS AND METHOD THEREOF

BACKGROUND

FIG. 1 illustrates a power amplifier device as is known in the art. The prior art power amplifier device includes a power divider 101 to receive an input signal, a plurality of data flow paths, and a power combiner 116 to provide an output signal.

One data flow path illustrated in FIG. 1 comprises input impedance matching structure 104, amplifying device 108, and output impedance matching structure 112. The amplifying device 109 is typically a transistor device that amplifies a received signal. Data flows through conductive elements 102, 106, 110, and 114 to create a data flow path from the power divider 101 to the power combiner 116.

Another data flow path, analogous to the first data path, includes input impedance matching structure 105, amplifying device 109, and output impedance matching structure 113. Data flows through conductive elements 103, 107, 111, and 115 connect the various data flow elements to create a second data flow path from the power divider 101 to the power combiner 116. While only two data flow paths are indicated in FIG. 1, it will be appreciated that other power amplifiers can contain additional data flow paths, or only one data flow path.

The output impedance matching structures 112 in combination with the conductive elements 110 are implemented to realize an output load line structure to allow for partial impedance matching between the amplifying device 108 and the signal out node.

The structure illustrated in FIG. 1 has an inherent disadvantage in that there is a strong intra-dependence between the fundamental and harmonic frequency terminations exhibited by this circuitry. This strong intra-dependence limits the ability to select design parameters which can simultaneously optimize both the fundamental frequencies, and the harmonic frequencies. The inability to optimize both fundamental and harmonic frequencies prevents class F operation, or near class-F operation, of the device. Therefore, a device and/or method overcoming this problem would be advantageous.

FIELD OF THE INVENTION

The present disclosure relates generally to power amplifiers, and more particularly to power amplifiers having load line structures with harmonic frequency termination structures.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

A power amplifier device is disclosed herein capable of being optimized for both a harmonic frequency termination, and a fundamental frequency termination of the amplified signal. In a specific embodiment, multiple load line structures substantially isolated from each other are coupled to an output node of a power transistor device. By modifying the characteristics of the separate load line structures independent optimization can be facilitated for terminating a signal at its fundamental frequency and harmonic frequency. Various aspects of the present disclosure will be better understood with reference to FIGS. 2–8 herein.

Figure 1:
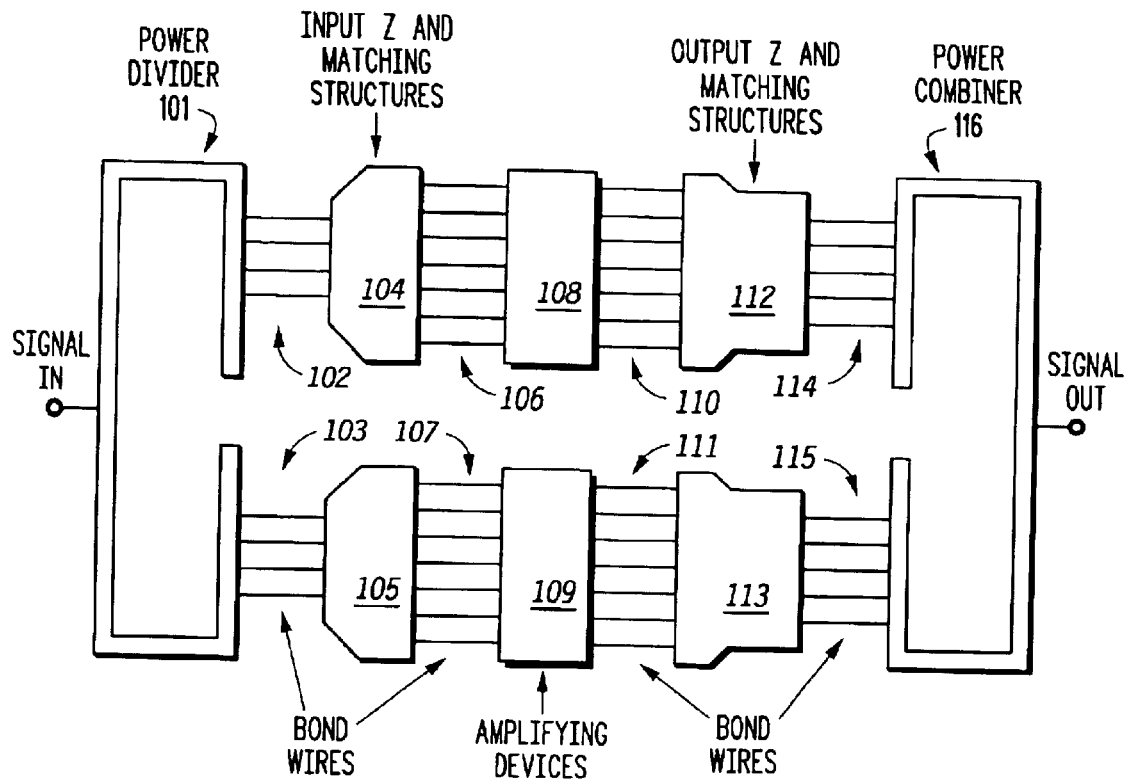
FIG. 1 illustrates, in block form, a prior art device.
Figure 2:
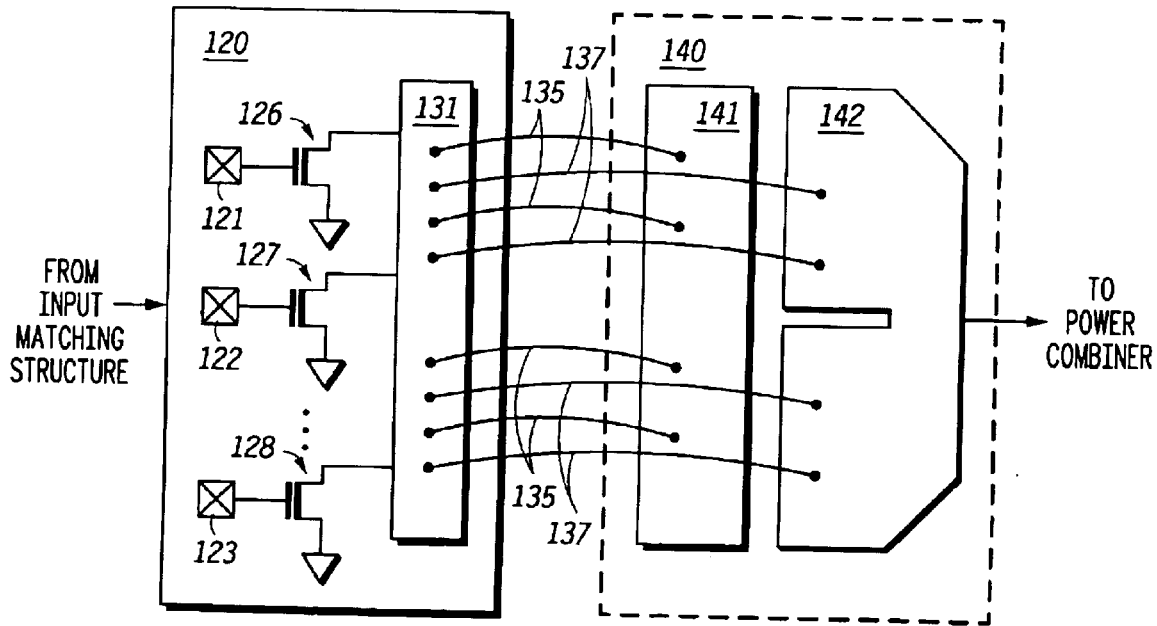
FIG. 2 illustrates, in block and schematic form, a plan view of a portion of a device in accordance with the present disclosure.

The power amplifier disclosed herein can have one or more data paths between an input power divider and an output power combiner. However, for purposes of discussion, FIGS. 2–8 discuss only a specific portion of one power amplifier data path. It will be appreciated that the concepts presented can be applied to multiple data paths. Therefore, FIG. 2 illustrates a portion of a power amplifying device data path. Specifically, FIG. 2 illustrates a data path portion of a power amplifying device that includes the amplifying device 120 and the output impedance matching structure 140. Those data path portions prior to the amplifying device 120, and subsequent to the output impedance matching structure-140 are substantially similar to those illustrated with reference to FIG. 1.

Amplifying device 120 typically includes a plurality of transistors 126–128 coupled in parallel. Each of the transistors 126–128 receives a substantially common input signal at their respective input node 121–123 from a power divider. The input nodes 121–123 are coupled to control electrodes of the transistors 126–128. As further illustrated in FIG. 2, each of the transistors 126–128 of amplifying device 120 has a current electrode coupled to ground and a second current electrode coupled to an output node (current electrode bus,) 131. A plurality of conductive elements 135 and 137 coupled to the output node 131 and to conductive structure 140. The conductive structure 140, also referred to as a load line structure or output impedance matching structure, includes a plurality of substantially isolated conductive structure portions.

Specifically, conductive structure 140 of FIG. 2 comprises a first conductive structure portion 141, and a second conductive structure portion 142 overlying a dielectric layer (not illustrated in FIG. 2). A first plurality of conductive elements 135 couples the output node 131 to the first conductive structure portion 141. Likewise, the second plurality of conductive elements 137 couples the output node 131 to the second conductive structure portion 142. The first plurality of conductive elements is mutually exclusive from the second plurality of conductive elements in that no conductive element is a member of both the first plurality and the second plurality of conductive elements.

The first and second conductive structure portions 141 and 142 are substantially isolated from each other. In one embodiment the first and second structures 141 and 142 are substantially isolated from each other in that the impedance looking into conductive structure portion 141 at a frequency of 500 MHz or greater is substantially unaffected by changes to conductive structure portion 142 that would be viewed as an impedance change when looking into conductive structure 142. Likewise, the impedance looking into conductive structure portion 142 is substantially unaffected by changes to conductive structure portion 141 that would be viewed as an impedance change when looking into conductive structure 141.

In one embodiment the conductive elements 135 and 137 are wire bonds. It will be appreciated, that by allowing for two bond wire sets, bond wire set 135 and bond wire set 137, and allowing for two unique and largely uncoupled metalized conductive structures (patterns) on a high-dielectric substrate (e.g. a dielectric constant greater than 15, and typically greater than 20), that load line realization optimized for a fundamental frequency can be obtained, as well as load line realization optimized at a harmonic frequency of the fundamental frequency. By allowing for optimization of load line realization at not only the fundamental frequency, but at a harmonic, such as a second harmonic, frequency the realization of a class F, or near class F, power amplifier can be realized. In operation, the combination of conductive element 135 and 141 create a series resonant circuit that, for resonant frequencies at the bus 131, effectively appears to have an impedance of zero, or near zero. Therefore, undesirable frequencies at the resonant frequency (e.g. the second harmonic frequency) are passed to the series resonant circuit formed by 135 and 141, and not to the power combiner. Furthermore, it will be appreciated that the implementation described in FIG. 2 is simple to implement, results in minimal cost additions to current manufacturing flows, and allows for a wider design space.

Figure 3:
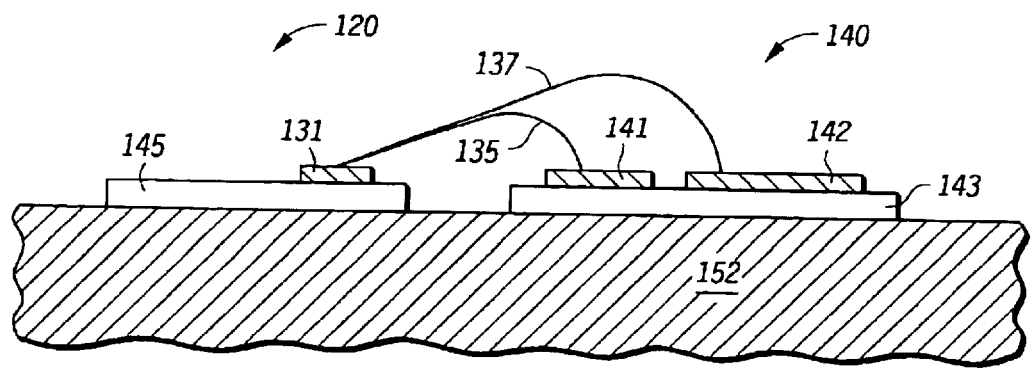
FIG. 3 illustrates, in a cross sectional view, the device of FIG. 2.

FIG. 3 illustrates a cross section of the device of FIG. 2. Specifically, FIG. 3 illustrates amplifying device 120 and a conductive structure 140 overlying a conductive substrate 152. The conductive structure 140 is formed over a dielectric layer 143. It will be appreciated, that the output node, drain bus, 131 as illustrated in FIG. 3 generally overlies one or more substrate layers, including a dielectric layer 145. Though not specifically illustrated, the device 120 as is well known in the art, will typically have dielectric layers separating conductive layers from other conductive layers. In a specific embodiment, the dielectric layer underlying output node 131 will have a dielectric constant value of less than 15, and typically in the range of 9 to 13.

The conductive structure 140 in FIG. 3 comprises the conductive structure portion 141 and the conductive structure portion 142 overlying a dielectric layer 143. It will be appreciated that the dielectric layer 143 may be only a top portion of a substrate on which the conductive structures 141 and 142 are formed. In a specific embodiment, the dielectric constant of the dielectric 143 will have a dielectric constant of fifteen or greater and typically in the range of 79–180 as is found with certain ceramics. In a specific embodiment, the dielectric constant will be twenty or greater.

Clearly illustrated in the cross section of FIG. 3 are various geometric properties of the device. Examples of the various geometric properties include the length of the bond wires 135 and 137, the profile (shape) of the bond wires 135 and 137, and/or the diameters of the bond wires 135 and 137. The load line realization can be optimized independently for each conductive element/conductive structure pair by altering specific geometric properties of the conductive elements 135 and 137, as well as the properties of the conductive structure portions 141 and 142.

For example, as illustrated in FIG. 3, the length of the conductive element 135 is different from the length of the conductive layer 137. This results in a different inductance characteristic between the two sets of bond wires. By controlling the length of the bond wires 135 and the pattern or shape, of the conductive structure portion 141, the termination characteristic can be tuned to a particular frequency. Likewise, by controlling the length of the bond wires 137 and the pattern of the conductive structure portion 142, the termination characteristic can be tuned to a particular frequency.

Figure 4:
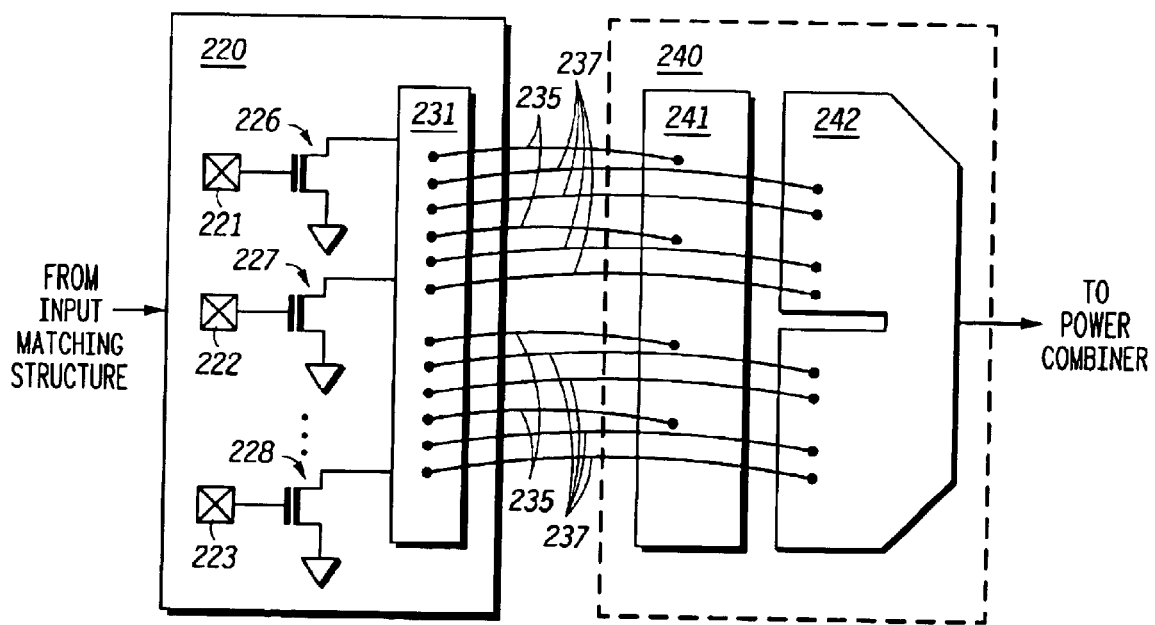
FIG. 4 illustrates, in block and schematic form, a plan view of a device in accordance with the present disclosure.

FIG. 4 shows an alternate embodiment of a power amplifying device in accordance with the present disclosure. Specifically, the number of bond wire connections coupled to the first conductive structure portion 241 is different then the number of conductive structures 237 coupled to the second conductive structure 142 portion. Again, as will be appreciated, by varying the number of conductive elements coupled to each of the specific conductive structures 241 and 242, the load line impedance realization may be optimized for more than one frequency component.

Figure 5:
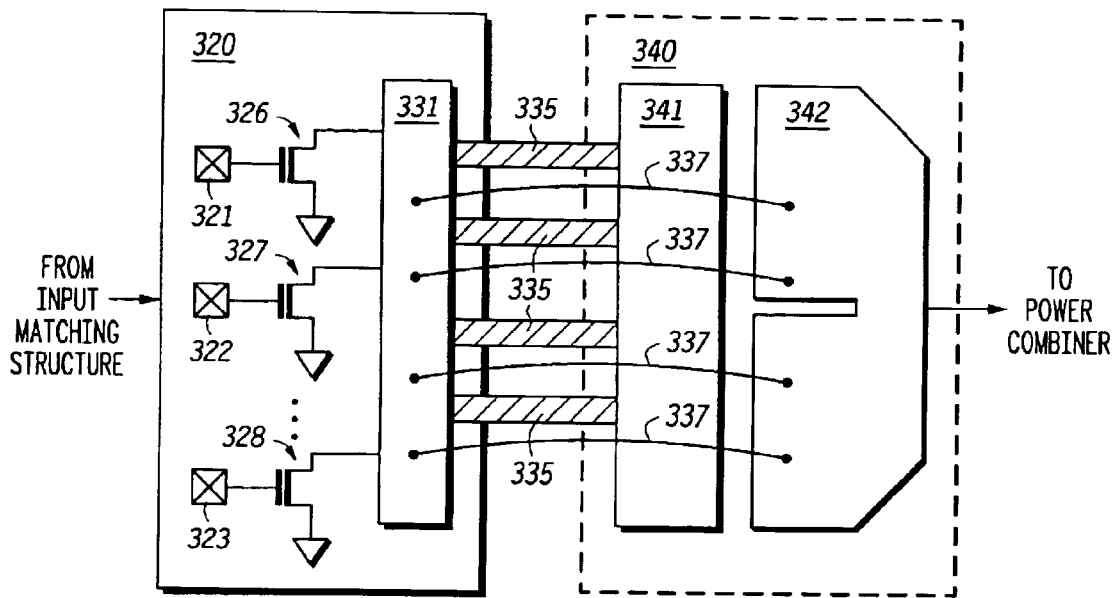
FIG. 5 illustrates, in block and schematic form, a plan view of another embodiment in accordance with the present disclosure.

FIG. 5 illustrates another embodiment of the present disclosure, whereby at least one of the sets of conductive elements, for example conductive elements 335, are formed by trace lines as opposed to bond wires. In a manner similarly discussed with respect to the bond wires, the various geometric properties of the trace lines can be varied to affect the inductance, and ultimately the final load line impedance realized by the combination of trace lines 335 and conductive structure 341. Examples of physical properties relating to trace lines include trace line width, trace line length, and trace line thickness, as well as conductive properties of the material comprising the trace line.

Figure 6:
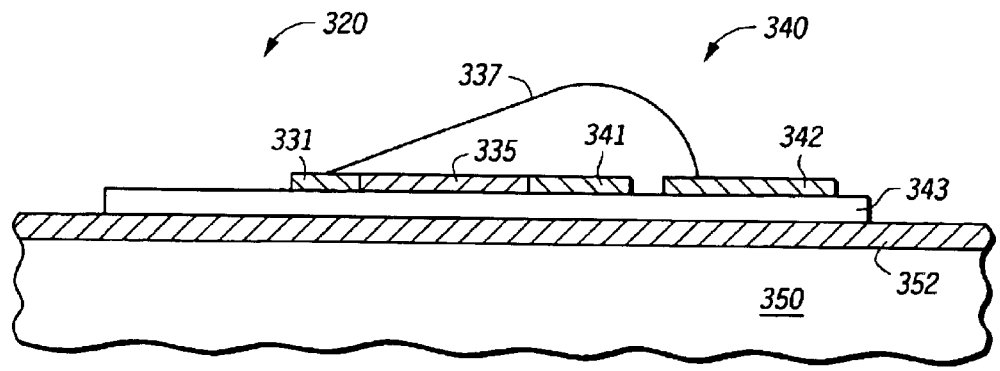
FIG. 6 illustrates a cross sectional view of the device of FIG. 5.

FIG. 6 illustrates a cross sectional view of the device of FIG. 5, illustrating that the trace lines 335 are formed over a substrate 340 in common with the power device 331 and the conductive structures 341 and 342. Such an implementation is illustrated in FIG. 6, FIGS. 5 and 6 are possible, and advantageous, wherein the processes used to form the power devices 326–328 are compatible with the formation of the conductive structures 341 and 342.

Figure 7:
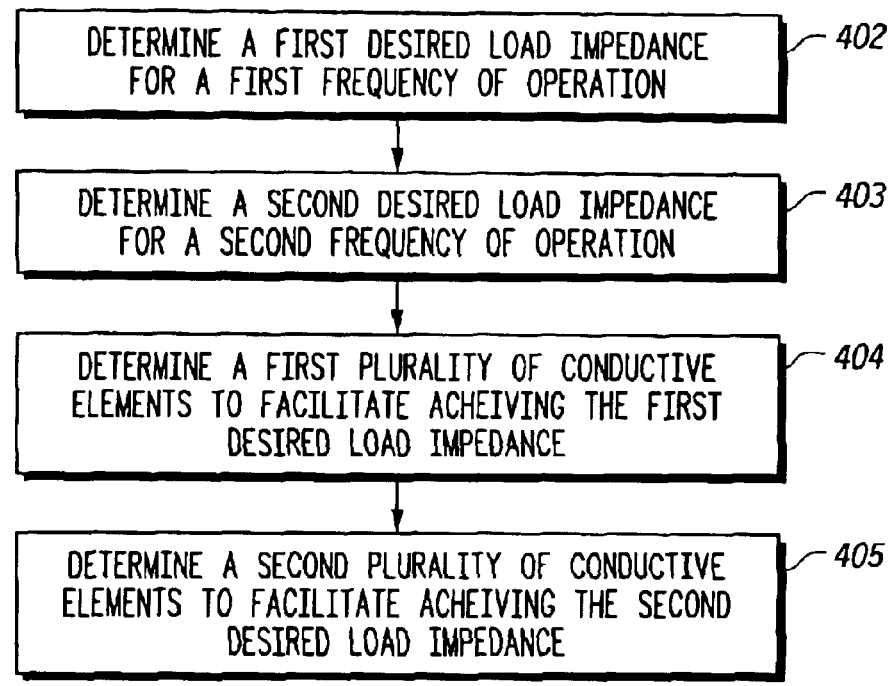
FIG. 7 illustrates, in flow diagram form, a method in accordance with the present disclosure.

FIG. 7 illustrates, in flow diagram form, a method in accordance with the present invention. In step 402, a determination is made what a first desired load line impedance would be at a first frequency of operation such as the fundamental frequency. With respect to a power amplifier, such a frequency will typically be over 500 MHz, and more typically over 900 MHz. Such power amplifying devices have outputs that provide a power of greater than 1 watt and typically over 200 watts. As illustrated in FIGS. 2–6, multiple transistors are generally used to generate the power increase.

It will be appreciated that there are numerous commercially available simulation tools that simulate various conductive structure/conductive element combinations which can be used to facilitate implementing a selected impedance. One example of such commercially available simulator is the HFSS™ simulator tool available from Ansoft Corporation.

At step 403, a determination is made as to what a second desired load impedance would be desirable for a second frequency of operation such as a second harmonic frequency. By being able to determine a first and second desired load impedance at steps 402 and 403, it is possible to realize an F-class, or near F-class amplification. At step 404, a first plurality of conductive elements are defined in order to facilitate achieving the first desired load impedance. Methods of selecting conductive elements, such as bond wires in combination with conductive patterns or structures to obtain termination for desired frequency are known by those skilled in the art.

At step 405, in a manner similar to that described in step 404, a second set of plurality of conductive elements are defined to facilitate achieving a second desired load impedance. Again, it is well understood by those skilled in the art how to achieve a desired termination impedance by selecting the characteristics of the interconnects, such as the bond wires, and the conductive structures or patterns as described herein.

It will be appreciated that the method described in FIG. 7 may be advantageous over the prior art in that it may allow for the selection and optimization of impedance terminations at not only a fundamental frequency, but at a harmonic frequency as well, thereby facilitating an increased efficiency of the powered device.

Figure 8:
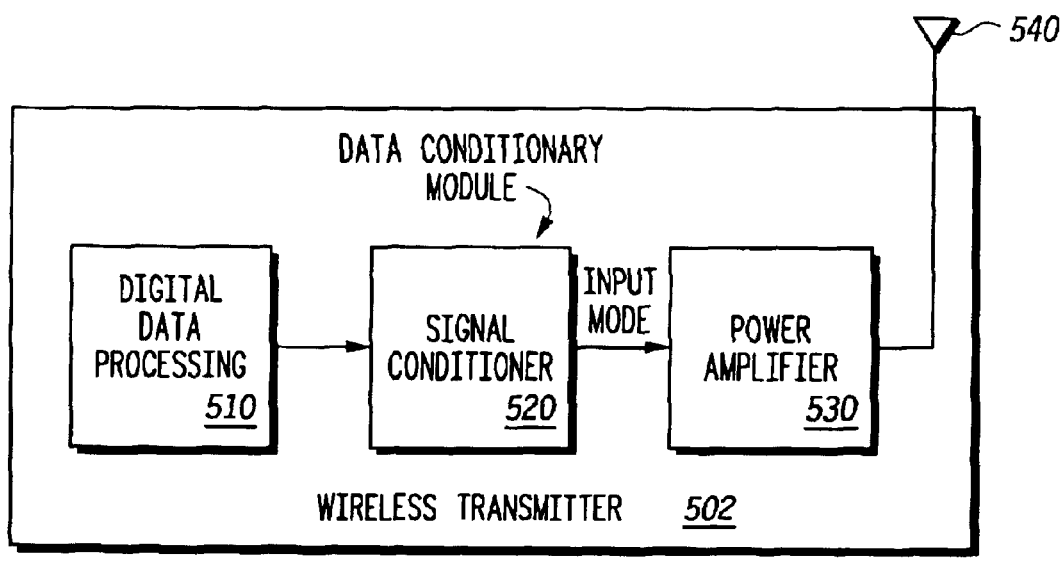
FIG. 8 illustrates, in block form, a specific application in accordance with the present disclosure.

FIG. 8 illustrates a specific application using a power amplifier device as described herein. Specifically, FIG. 8 illustrates a system 500 comprising a wireless transmitter and an antenna 540.

The wireless transmitter 502 includes a data processing module 510 for processing data to be transmitted. The digital data processing module 510 provides the data to be transmitted to a signal conditioner module 520. The signal conditioner module 520 will typically mix the data received from digital data processing module 510 with other frequencies in preparation for transmitting the data at a desired frequency. The signal conditioner 520 provides the conditioned data to an input node of the power amplifier 530. The power amplifier 530 operates in the manner described previously herein whereby the conditioned signal is received at a control node of one or more transistors which in turn provide an amplified signal to an output node. The output node is coupled to a plurality of conductive structure portions through a plurality of conductive elements. By varying one or more geometric property of the plurality of conductive elements based upon which conductive structure their coupled to the device can be tuned to multiple harmonics. The power from the plurality of conductive structure portions is provided to a power combiner for output at an output node coupled to the antennae 540. In this manner a highly efficient balanced amplifier can be realized.

In the preceding detailed description of the figures, reference has been made to the accompanying drawings which form a part thereof, and in which is shown by way of illustration specific embodiments in which the disclosure may be practiced. These embodiments are described in sufficient detail to enable those skilled in the art to practice the disclosure, and it is to be understood that other embodiments may be utilized and that logical, mechanical, chemical and electrical changes may be made without departing from the spirit or scope of the disclosure. For example, while the disclosure herein has focused primarily on varying properties of bond wires to have different characteristics, such as length values, however it will be appreciated that the shape of the conductive structure portions can be modified as well. To avoid detail not necessary to enable those skilled in the art to practice the disclosure, the description may omit certain information known to those skilled in the art. Furthermore, many other varied embodiments that incorporate the teachings of the disclosure may be easily constructed by those skilled in the art. Accordingly, the present disclosure is not intended to be limited to the specific form set forth herein, but on the contrary, it is intended to cover such alternatives, modifications, and equivalents, as can be reasonably included within the spirit and scope of the disclosure. The preceding detailed description is, therefore, not to be taken in a limiting sense, and the scope of the present disclosure is defined only by the appended claims.

What is claimed is:

1. An amplifying apparatus comprising:
    a first dielectric layer;
    a conductive structure, overlying the dielectric layer, comprising a first conductive structure portion to receive a power amplified signal and a second conductive structure portion to receive the power amplified signal, the first conductive structure portion substantially electrically isolated from the second conductive structure portion;
    a first plurality of conductive elements coupled to the first conductive structure portion; and
    a second plurality of conductive elements coupled to the second conductive structure portion, wherein the first plurality of conductive elements is mutually exclusive from the second plurality of conductive elements.

2. The apparatus of claim 1, wherein the first plurality of conductive elements comprise wire bonds.

3. The apparatus of claim 2, wherein the second plurality of conductive elements comprise wire bonds.

4. The apparatus of claim 2, wherein the second plurality of conductive elements comprise trace lines.

5. The apparatus of claim 4, wherein the first conductive structure portion and the second conductive structure portion are formed from a metalized layer overlying the first dielectric laser.

6. The apparatus of claim 1, wherein a number of conductive elements in the first plurality of elements is different than a number of conductive elements in the second plurality of elements.

7. The apparatus of claim 1, wherein a number of conductive elements in the first plurality of elements is the same as a number of conductive elements in the second plurality of elements.

8. The apparatus of claim 1 further comprising:
    a conductive output operably coupled to at least one transistor to receive a signal oscillating at a frequency greater than 500 MHz, the conductive output coupled to the first plurality of conductive structures and to the second plurality of conductive structures.

9. The apparatus of claim 8 further comprising:
    a second dielectric layer underlying the conductive output, and wherein the first dielectric layer does not underlie the conductive output.

10. The apparatus of claim 9, wherein the first dielectric layer has a dielectric constant greater than 15, and the second dielectric layer has a dielectric constant less than 15.

11. The apparatus of claim 8, wherein at least one of the plurality of first conductive elements is coupled to the conductive output between two of the plurality of second conductive elements.

12. The apparatus of claim 1, wherein the first dielectric layer has a dielectric constant greater than 15.

13. An amplifying apparatus comprising:
    an output node;
    a plurality of conductive elements coupled to the output node, each one of the conductive elements having a geometric property, wherein a first portion of the plurality of conductive elements have a first characteristic for their geometric property, and a second portion of the plurality of conductive elements have a second characteristic for their geometric property, where the second characteristic is different than the first characteristic; and a load line structure comprising:
   a first conductive pattern coupled to each conductive element of the first portion of the plurality of conductive elements; and
   a second conductive pattern coupled to each conductive element of the second portion of the plurality of conductive elements, wherein the first and second conductive patterns are substantially isolated from each other at that layer.

14. The apparatus of claim 13, wherein the geometric property is a length of a conductive element and the first and second characteristics represent different lengths.

15. The apparatus of claim 13, wherein the geometric property is a profile and the first and the second characteristics represent different profiles.

16. The apparatus of claim 13, wherein the geometric property is a bond wire diameter, where the first and second characteristics represent different diameters.

17. The apparatus of claim 13, wherein
   the first and second conductive patterns are formed from a common conductive layer.

18. The apparatus of claim 17, wherein substantially isolated indicates that the impedance observed at the first conductive pattern is largely unaffected by impedance changes observed at the second conductive pattern at frequencies greater than 500 MHz.

19. The apparatus of claim 13 further comprising:
   a dielectric having a dielectric constant greater than 15 underlying the first and second conductive patterns.

20. The apparatus of claim 1, further comprising a signal bus coupled to the first and second plurality of conductive elements, the signal bus to provide the power amplified signal.

* * * * *

UNITED STATES PATENT AND TRADEMARK OFFICE
CERTIFICATE OF CORRECTION

PATENT NO. : 6,833,761 B2
DATED : December 21, 2004
INVENTOR(S) : Staudinger et al.

It is certified that error appears in the above-identified patent and that said Letters Patent is hereby corrected as shown below:

Column 6,
Line 33, please change the word "laser" to -- layer. --.

Signed and Sealed this

Twelfth Day of April, 2005

JON W. DUDAS
*Director of the United States Patent and Trademark Office*